United States Patent
Malatkar et al.

(10) Patent No.: US 9,224,674 B2
(45) Date of Patent: Dec. 29, 2015

(54) PACKAGED SEMICONDUCTOR DIE WITH BUMPLESS DIE-PACKAGE INTERFACE FOR BUMPLESS BUILD-UP LAYER (BBUL) PACKAGES

(75) Inventors: Pramod Malatkar, Chandler, AZ (US); Weng Hong Teh, Phoenix, AZ (US); John S. Guzek, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 378 days.

(21) Appl. No.: 13/996,495

(22) PCT Filed: Dec. 15, 2011

(86) PCT No.: PCT/US2011/065269
§ 371 (c)(1),
(2), (4) Date: Jun. 20, 2013

(87) PCT Pub. No.: WO2013/089754
PCT Pub. Date: Jun. 20, 2013

(65) Prior Publication Data
US 2013/0270715 A1    Oct. 17, 2013

(51) Int. Cl.
| | |
|---|---|
| H01L 27/08 | (2006.01) |
| H01L 23/552 | (2006.01) |
| H01L 23/48 | (2006.01) |
| H01L 23/00 | (2006.01) |

(52) U.S. Cl.
CPC .............. *H01L 23/481* (2013.01); *H01L 24/19* (2013.01); *H01L 24/97* (2013.01); *H01L 27/08* (2013.01); *H01L 23/552* (2013.01); *H01L 2224/04105* (2013.01); *H01L 2224/32245* (2013.01); *H01L 2224/73267* (2013.01); *H01L 2224/97* (2013.01); *H01L 2924/10253* (2013.01); *H01L 2924/14* (2013.01); *H01L 2924/1433* (2013.01); *H01L 2924/1434* (2013.01); *H01L 2924/15153* (2013.01)

(58) Field of Classification Search
CPC .............................. H01L 27/08; H01L 23/552
USPC ................................................... 257/531, 659
See application file for complete search history.

(56) References Cited

U.S. PATENT DOCUMENTS

| | | |
|---|---|---|
| 2006/0068332 A1 | 3/2006 | Chen |
| 2006/0115931 A1 | 6/2006 | Hsu |
| 2009/0250803 A1 | 10/2009 | Arai |
| 2011/0254124 A1 | 10/2011 | Nalla et al. |

OTHER PUBLICATIONS

International Search Report and Written Opinion for PCT Patent Application No. PCT/US2011/065269 Mailed Sep. 17, 2012, 9 Pages.
International Preliminary Report on Patentability from PCT/US2011/065269 mailed Jun. 26, 2014, 6 pgs.
Office Action and Search Report from Taiwanese Patent Application No. 101142633 dated Jan. 20, 2015, 9 pgs.

*Primary Examiner* — Elvis O Price
(74) *Attorney, Agent, or Firm* — Blakely, Sokoloff, Taylor & Zafman LLP

(57) ABSTRACT

A packaged semiconductor die with a bumpless die-package interface and methods of fabrication are described. For example, a semiconductor package includes a substrate having a land side with a lowermost layer of conductive vias. A semiconductor die is embedded in the substrate and has an uppermost layer of conductive lines, one of which is coupled directly to a conductive via of the lowermost layer of conductive vias of the substrate. In another example, a semiconductor package includes a substrate having a land side with a lowermost layer of conductive vias. A semiconductor die is embedded in the substrate and has an uppermost layer of conductive lines with a layer of conductive vias disposed thereon. At least one of the conductive lines is coupled directly to a conductive via of the semiconductor die which is coupled directly to a conductive via of the lowermost layer of conductive vias of the substrate.

28 Claims, 11 Drawing Sheets

PACKAGED SEMICONDUCTOR DIE WITH BUMPLESS DIE-PACKAGE INTERFACE FOR BUMPLESS BUILD-UP LAYER (BBUL) PACKAGES

CLAIM OF PRIORITY

This application is a U.S. National Phase application under 35 U.S.C. §371 of International Application No. PCT/US2011/065269, filed Dec. 15, 2011, entitled "PACKAGED SEMICONDUCTOR DIE WITH BUMPLESS DIE-PACKAGE INTERFACE FOR BUMPLESS BUILD-UP LAYER (BBUL) PACKAGES," the entire contents of which are incorporated herein by reference.

TECHNICAL FIELD

Embodiments of the invention are in the field of semiconductor packages and, in particular, a packaged semiconductor die with a bumpless die-package interface.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

Bumpless Build-Up Layer or BBUL is a processor packaging technology. It is bumpless since it does not use the usual tiny solder bumps to attach the silicon die to the processor package wires. It has build-up layers since it is grown or built-up around the silicon die. The usual way is to manufacture them separately and bond them together. Some semiconductor packages now use a coreless substrate, which does not include the thick resin core layer commonly found in conventional substrates.

SUMMARY

Embodiments of the present invention include a packaged semiconductor die with a bumpless die-package interface and methods to form such a packaged semiconductor die.

In an embodiment, a semiconductor package includes a substrate having a land side with a lowermost layer of conductive vias. A semiconductor die is embedded in the substrate. The semiconductor die has an uppermost layer of conductive lines. At least one of the conductive lines is coupled directly to a conductive via of the lowermost layer of conductive vias of the substrate.

In another embodiment, a semiconductor package includes a substrate having a land side with a lowermost layer of conductive vias. A semiconductor die is embedded in the substrate. The semiconductor die has an uppermost layer of conductive lines with a layer of conductive vias disposed thereon. At least one of the conductive lines is coupled directly to a conductive via of the semiconductor die which is coupled directly to a conductive via of the lowermost layer of conductive vias of the substrate.

In another embodiment, a semiconductor package includes a substrate. The substrate includes a land side with a lowermost layer of conductive vias. A substrate dielectric layer encapsulates the layer of conductive vias. The semiconductor package also includes a semiconductor die embedded in the substrate. The semiconductor die includes an uppermost layer of conductive lines. At least one of the conductive lines is coupled directly to a conductive via of the lowermost layer of conductive vias of the substrate. A conformal dielectric layer is disposed on and covering at least a portion of the uppermost layer of conductive lines. The substrate dielectric layer is disposed directly on the conformal dielectric layer, which is nominally known as a die passivation layer or sometimes referred to as a hermetic layer. It need not serve the purpose as a dielectric per se.

In another embodiment, a semiconductor package includes a substrate. The substrate includes a land side with a lowermost layer of conductive routing. A next lowermost layer of conductive routing is disposed directly on the lowermost layer of conductive routing. A semiconductor die is embedded in the substrate. The semiconductor die has an uppermost layer of conductive lines. At least one of the conductive lines is coupled directly to the lowermost layer of conductive routing of the substrate.

DETAILED DESCRIPTION

Figure 1A:
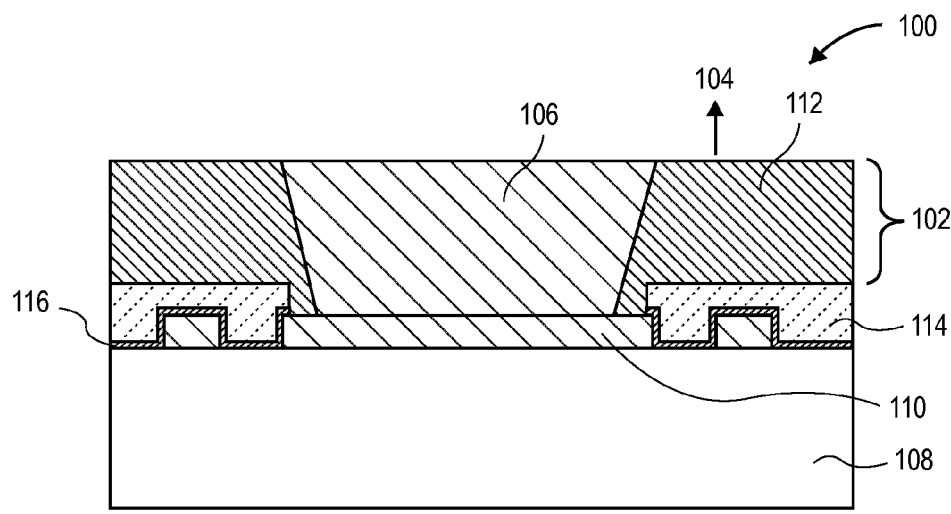
FIG. 1A illustrates a cross-sectional view of a portion of a packaged semiconductor die with a bumpless die-package interface, in accordance with an embodiment of the present invention.

A packaged semiconductor die with a bumpless die-package interface and methods to form such a packaged semiconductor die are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Embodiments described herein may provide optimized chip designs for use with BBUL packages. For example, one or more embodiments enable co-optimization of the die design of a semiconductor die and a BBUL process to obtain an optimized BBUL package for the semiconductor die. Embodiments described herein may enable elimination or modification of the die design and process operations that may not be required from a BBUL process perspective. For example, one or more of (a) removal of copper bumps, (b) plating of surface copper layer onto a photo-sensitive layer, or (c) using a non-photo-sensitive dielectric layer may be used. Benefits may include achieving benefits like thermal budget and cost reduction, package Z height reduction, or lower interlayer dielectric (ILD) stresses.

Conventional BBUL processing involves embedding a semiconductor die in a substrate. Vias are drilled and plated with copper for interconnection between the semiconductor die and the substrate. By contrast, and in accordance with an embodiment of the present invention, at least a portion of typical packaging processing is moved to the back-end fabrication processing of the semiconductor die. In one such embodiment, copper bumps are removed from a semiconductor die (e.g., no bumps are used in fabrication or packaging). In another such embodiment, self-aligned vias are generated. In another such embodiment, a photo-sensitive layer is replaced with a substrate dielectric layer, reducing the overall number of semiconductor die layers. In another such embodiment, the first metal layer in a substrate (L1) is plated instead of being formed through bump formation. Other embodiments include combinations of two or more of the above listed embodiments.

Embodiments of the present invention may be incorporated into recessed and embedded semiconductor die coreless packages. For example, the basic BBUL process may be exploited and the BBUL front-end process modified such that BBUL processing can integrate a semiconductor die without the use of bumps (such as copper bumps) and, possible, without a WPR layer (described below). In one embodiment, a scalable substrate dielectric film lamination and gap fill method is provided using a BBUL process, through UV laser or photosensitive approaches. It is to be understood that the term "bumpless" in bumpless build up layer or BBUL, refers to no solder bumps, as otherwise used in traditional C4. Meanwhile, bumpless as used in embodiments herein refers to the absence of, e.g., copper pillar bumps from an incoming silicon die.

In an embodiment, a bumpless BBUL structure is formed by elimination of copper bumps from a semiconductor die. For example, FIG. 1A illustrates a cross-sectional view of a portion of a packaged semiconductor die with a bumpless die-package interface, in accordance with an embodiment of the present invention.

Referring to FIG. 1A, a portion 100 of a semiconductor package includes a portion of a substrate 102 having a land side 104 with a lowermost layer of conductive vias, such as via 106 shown in FIG. 1A. A semiconductor die (portion 108 shown) is embedded in the substrate 102. The semiconductor die 108 has an uppermost layer of conductive lines, such as conductive line 110 shown in FIG. 1A. At least one of the conductive lines 110 is coupled directly to a conductive via 106 of the lowermost layer of conductive vias of the substrate 102. In accordance with an embodiment of the present invention, the conductive via 106 and the conductive line 110 form a bumpless interface between the substrate 102 and the semiconductor die 108.

In an embodiment, the substrate 102 includes a substrate dielectric layer 112 (e.g., an ABF film). The substrate dielectric layer 112 encapsulates the conductive via 106 and is disposed on at least a portion of the conductive line 110. In an embodiment, semiconductor package 100 further includes a patterned photo-sensitive passivating film 114 (e.g., a WPR film) disposed adjacent to the conductive line 110. Thus, a landing region on conductive line 110 may have been generated by photolithography. A conformal dielectric layer 116, such as a silicon nitride layer, may also be included. In an embodiment, the conductive via 106 and the conductive line 110 are composed of copper.

Thus, in an embodiment, a BBUL process is integrated with a bumpless semiconductor die. In one such embodiment, via 0 (V0) is landed directly on the top metal line (TM1) of a semiconductor die having no bumps. This approach may enable elimination of bumps as well as through via1 (TV1) otherwise present in between TM1 and BBUL V0 in convention packages. In an embodiment, a landing pad style approach is used, which may be designed to accept V0 (e.g., as a relatively broad feature) without the need for copper bumps on the semiconductor die. In an embodiment, the incoming semiconductor die has a WPR layer exposed and developed with a silicon nitride layer opened (e.g., by dry etch) to reveal TM1 landing pads. BBUL process integration may then proceed with ABF lamination and gap-fill over WPR and the silicon nitride openings followed by UV laser or photolithography (if using photosensitive ABF) to form BBUL V0. Nominally, in an embodiment, the TM1 layer has landing pads approximately 10-60 microns wide.

In another embodiment, a bumpless BBUL structure is formed by using self-aligned via fabrication along with exclusion of copper bumps. For example, FIG. 1B illustrates a cross-sectional view of a portion of a packaged semiconductor die with another bumpless die-package interface, in accordance with another embodiment of the present invention.

Figure 1B:
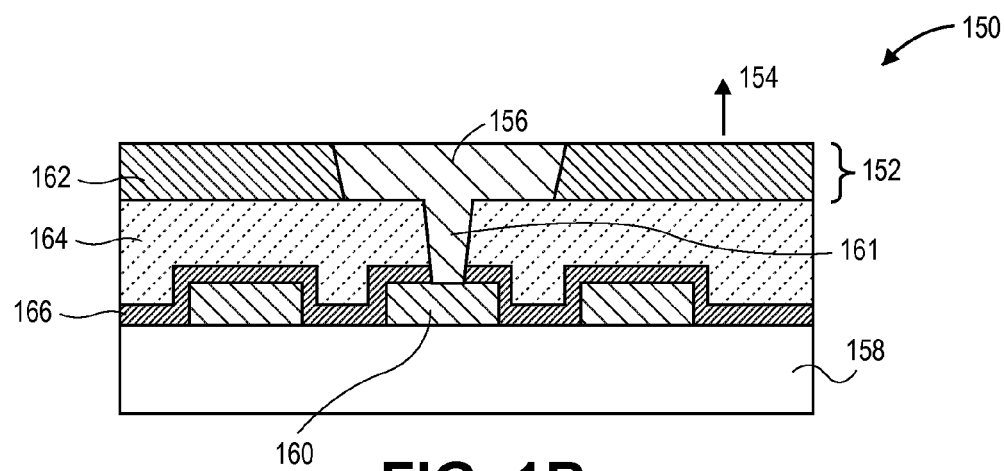
FIG. 1B illustrates a cross-sectional view of a portion of a packaged semiconductor die with another bumpless die-package interface, in accordance with another embodiment of the present invention.

Referring to FIG. 1B, a portion 150 of a semiconductor package includes a portion of a substrate 152 having a land side 154 with a lowermost layer of conductive vias, such as via 156 shown in FIG. 1B. A semiconductor die (portion 158 shown) is embedded in the substrate 152. The semiconductor die 158 has an uppermost layer of conductive lines, such as conductive line 160 shown in FIG. 1B. A layer of conductive vias is disposed on the uppermost layer of conductive lines, such as conductive via 161 shown in FIG. 1B. At least one of the conductive lines 160 is coupled directly to a conductive via 161 of the semiconductor die 158 which is coupled directly to a conductive via 156 of the lowermost layer of conductive vias of the substrate 152. In accordance with an embodiment of the present invention, the conductive via 156, the conductive via 161, and the conductive line 160 form a bumpless interface between the substrate 152 and the semiconductor die 158.

In an embodiment, the substrate 152 includes a substrate dielectric layer 162 (e.g., an ABF film). The substrate dielectric layer 162 encapsulates the conductive via 156 but not the conductive via 161. In an embodiment, semiconductor package 150 further includes a passivating film 164 (e.g., a WPR film) disposed adjacent to the conductive via 161. A conformal dielectric layer 166, such as a silicon nitride layer, may also be included. In an embodiment, the conductive via 156, the conductive via 161, and the conductive line 160 are composed of copper.

In an embodiment, the substrate dielectric layer 152 is photosensitive. In one such embodiment, the substrate dielectric layer 152 is the only layer patterned upon coupling the semiconductor die 158 and the substrate 152. For example, the location of via 161 may be predetermined at die fabrication prior to substrate fabrication. In a specific such embodiment, with respect to forming the conductive vias, the conductive via 161 of the semiconductor die 158 and the conductive via 156 of the substrate 152 are self-aligned.

Thus, in an embodiment, a BBUL L1 layer is directly patterned using photosensitive ABF over an incoming fab photo-patterned TV1 (e.g., a "self-aligned via") without the need for copper bumps on the incoming semiconductor die. This approach may enable a top metal fab layer to retain fab design rules, e.g., TM1 widths of less than approximately 6 microns despite the much larger panel level BBUL design rules.

In another embodiment, a bumpless BBUL structure is formed by removing both copper bumps and a WPR layer from an incoming semiconductor die. For example, FIG. 2 illustrates a cross-sectional view of a portion of a packaged semiconductor die with another bumpless die-package interface, in accordance with another embodiment of the present invention.

Figure 2:
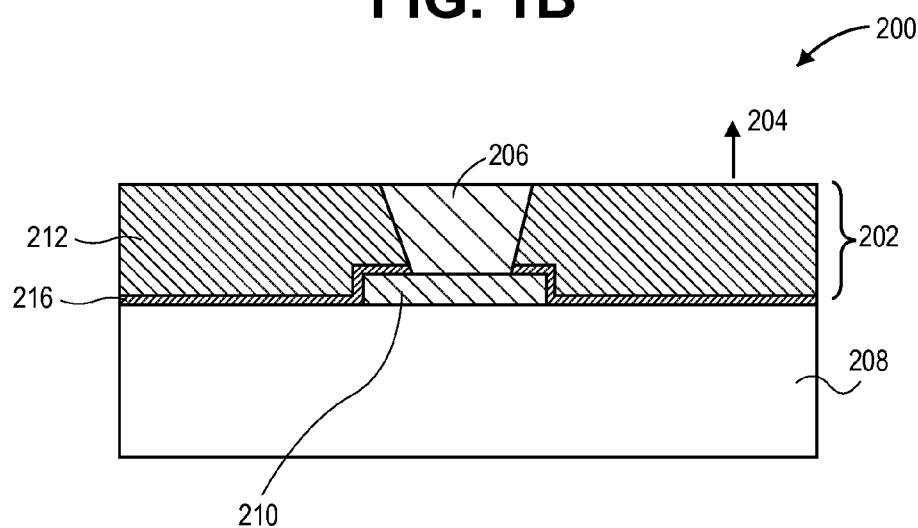
FIG. 2 illustrates a cross-sectional view of a portion of a packaged semiconductor die with another bumpless die-package interface, in accordance with another embodiment of the present invention.

Referring to FIG. 2, a portion 200 of a semiconductor package includes a portion of a substrate 202 having a land side 204 with a lowermost layer of conductive vias, such as via 206 shown in FIG. 2. The substrate 202 also includes a substrate dielectric layer 212 (e.g., an ABF film). The substrate dielectric layer 212 encapsulates the conductive via 206. The semiconductor package also includes a semiconductor die (portion 208 shown) embedded in the substrate 202. The semiconductor die 208 has an uppermost layer of conductive lines, such as conductive line 210 shown in FIG. 2. At least one of the conductive lines 210 is coupled directly to a conductive via 206 of the lowermost layer of conductive vias of the substrate 202. The semiconductor die 208 also includes a conformal dielectric layer 216, such as a silicon nitride layer, disposed on and covering at least a portion of the uppermost layer of conductive lines 210. The substrate dielectric layer 212 is disposed directly on the conformal dielectric layer 216.

In accordance with an embodiment of the present invention, the conductive via 206 and the conductive line 210 form a bumpless interface between the substrate 202 and the semiconductor die 208. In one embodiment, the conductive via 206 and the conductive line 210 are composed of copper. Thus, in an embodiment, a BBUL V0 via is formed to directly land on a top metal layer (TM1) without the need for copper bumps and a WPR layer on the incoming semiconductor die.

In another embodiment, a bumpless BBUL structure is formed by removing copper bumps, a surface copper layer, and a WPR layer from an incoming semiconductor die. For example, FIG. 3 illustrates a cross-sectional view of a portion of a packaged semiconductor die with another bumpless die-package interface, in accordance with another embodiment of the present invention.

Figure 3:
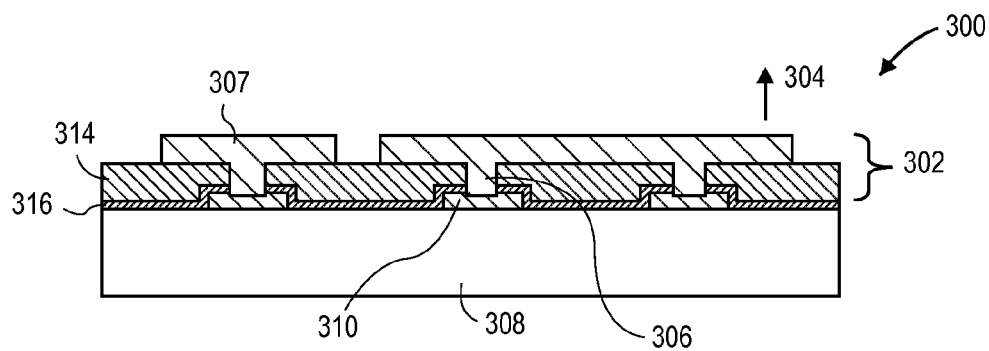
FIG. 3 illustrates a cross-sectional view of a portion of a packaged semiconductor die with another bumpless die-package interface, in accordance with another embodiment of the present invention.

Referring to FIG. 3, a portion 300 of a semiconductor package includes a portion of a substrate 302 having a land side 304 with a lowermost layer of conductive routing, such as conductive feature 306 shown in FIG. 3. The substrate 302 also includes a next lowermost layer of conductive routing 307 disposed directly on the lowermost layer of conductive routing 306. The semiconductor package also includes a semiconductor die (portion 308 shown) embedded in the substrate 302. The semiconductor die 308 has an uppermost layer of conductive lines, such as conductive line 310 shown in FIG. 3. At least one of the conductive lines 310 is coupled directly to the lowermost layer of conductive routing 306 of the substrate 302. In accordance with an embodiment of the present invention, the conductive line 310 of the semiconductor die 310 and the lowermost layer of conductive routing 306 of the substrate 302 form a bumpless interface between the substrate 302 and the semiconductor die 308.

In an embodiment, the next lowermost layer of conductive routing 307 is a layer of conductive traces. In one such embodiment, the lowermost layer of conductive routing 306 is a layer of conductive vias. In another such embodiment, the lowermost layer of conductive routing 306 is a layer of conductive traces.

In an embodiment, the substrate 302 further includes a photo-sensitive passivating film 314 (e.g., a WPR film) encapsulating the lowermost layer of conductive routing 306. In one such embodiment, the semiconductor die 308 further includes a conformal dielectric layer 316, such as a silicon nitride layer, disposed on and covering at least a portion of the uppermost layer of conductive lines 310. The photo-sensitive passivating film 314 is disposed directly on the conformal dielectric layer 316. In an embodiment, the conductive line 310 of the semiconductor die 308 and the lowermost layer of conductive routing 306 of the substrate 302 are composed of copper.

Depending on the above architecture, package routing may be restricted in area. For example, the approach described in association with FIG. 3 may constrain the substrate routing to the surface area of the semiconductor die. In an embodiment, referring again to FIG. 3, the lowermost layer of conductive routing is, from a top-down perspective, confined to the size of the semiconductor die. As an example, FIG. 4 illustrates a plan view of a portion of a packaged semiconductor die with a bumpless die-package interface, in accordance with another embodiment of the present invention.

Figure 4:
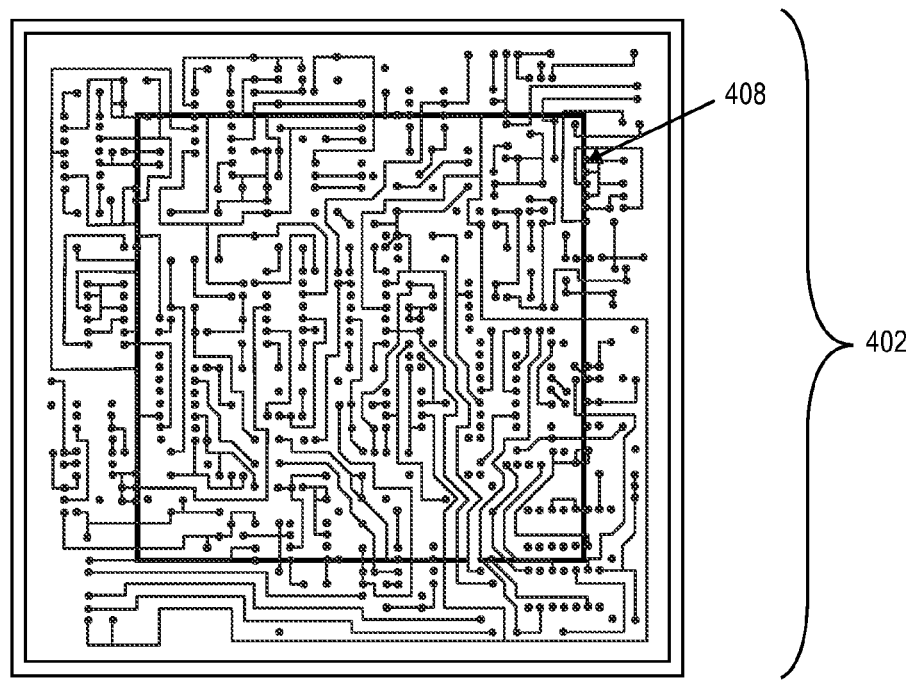
FIG. 4 illustrates a plan view of a portion of a packaged semiconductor die with a bumpless die-package interface, in accordance with another embodiment of the present invention.

Referring to FIG. 4, a semiconductor die 408 is embedded in a substrate 402. A surface copper layer (e.g., a Layer 1 or L1) routing within the semiconductor die area (e.g., primarily power gating in the interior and some I/O along the periphery) may be plated directly onto a WPR layer, e.g., as described in association with FIG. 3. By contrast, referring to FIG. 1B, the entire L1 routing may be plated directly onto WPR, since the plating is performed as part of the BBUL process.

In an embodiment, one or more of the above substrates 102, 152, 202, 302, or 402 is a bumpless build-up layer (BBUL) substrate. In one embodiment, electrically conductive vias and routing layers are formed above the structures shown in FIG. 1A, 1B, 2, 3 or 4 using a semi-additive process (SAP) to complete remaining layers of a bumpless build-up layer (BBUL) process. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA).

In an embodiment, one or more of the above substrates 102, 152, 202, 302, or 402 is a coreless substrate. Thus, in accordance with an embodiment of the present invention, a panel is used to support packaging of a semiconductor die through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

In an embodiment, one or more of the above semiconductor die 108, 158, 208, 308, 408 includes an active surface may include a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments.

The packaged semiconductor die may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

The packaged semiconductor die may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

Examples of fabrication process that may be implemented to provide the packages of FIG. 1A, 1B, 2-4, or similar packages, are described below.

In a first aspect, copper bumps may be eliminated from a package coupled with an embedded semiconductor die therein. In an example, FIGS. 5A-5H illustrate cross-sectional views representing various operations in a method of fabricating a packaged semiconductor die with a bumpless die-package interface, in accordance with another embodiment of the present invention.

Figure 5A:
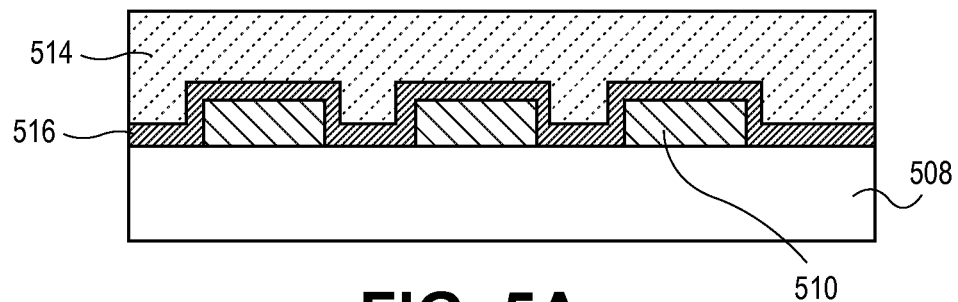
FIGS. 5A-5H illustrate cross-sectional views representing various operations in a method of fabricating a packaged semiconductor die with a bumpless die-package interface, in accordance with another embodiment of the present invention.

Referring to FIG. 5A, an incoming semiconductor die 508 has disposed thereon metal lines 510. A conformal dielectric layer 516, e.g. a silicon nitride film, is disposed on the metal lines 510. A photo-sensitive passivating film 514 (e.g., a WPR film) is disposed on the conformal dielectric layer 516. The photo-sensitive passivating film 514 may have a thickness approximately in the range of 13-15 microns, the metals lines 510 may have a thickness approximately in the range of 4-8 microns, and the conformal dielectric layer 516 may have a thickness approximately in the range of 1-2 microns.

Figure 5B:
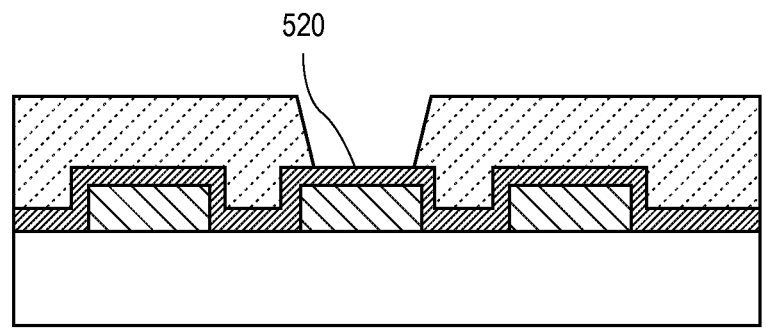
Figure 5C:
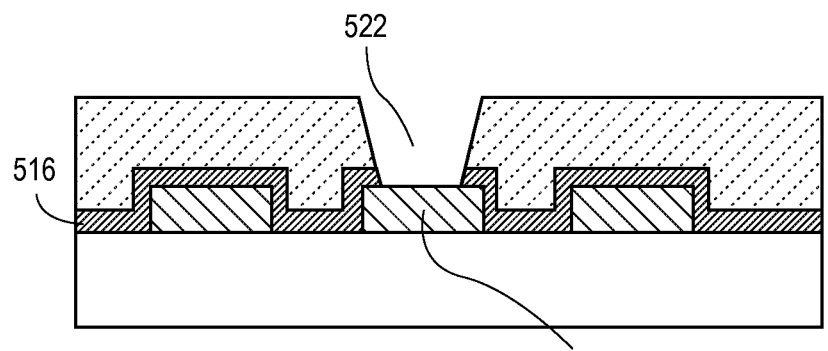

Referring to FIG. 5B, photo-sensitive passivating film 514 is patterned to expose a landing pad forming feature 520. In an embodiment, the landing pad, as sized at the bottom of the opening has a width approximately in the range of 10-60 microns. In an embodiment, the size of the opening is suitable to accommodate BBUL panel level design rules. The landing pad feature is transferred to by patterning a portion of the conformal dielectric layer 516 to form a via opening 522 and to expose a top of a metal line 510, as depicted in FIG. 5C.

Figure 5D:
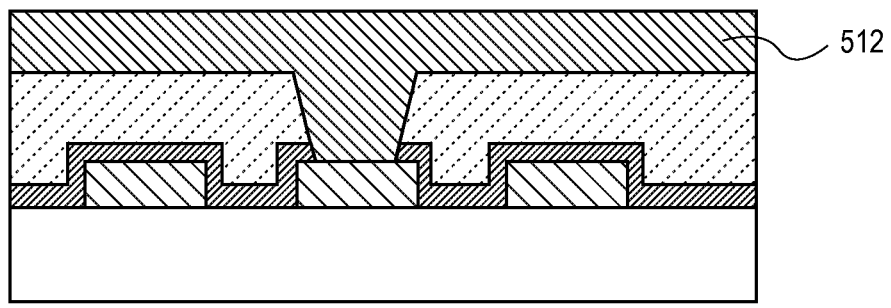
Figure 5E:
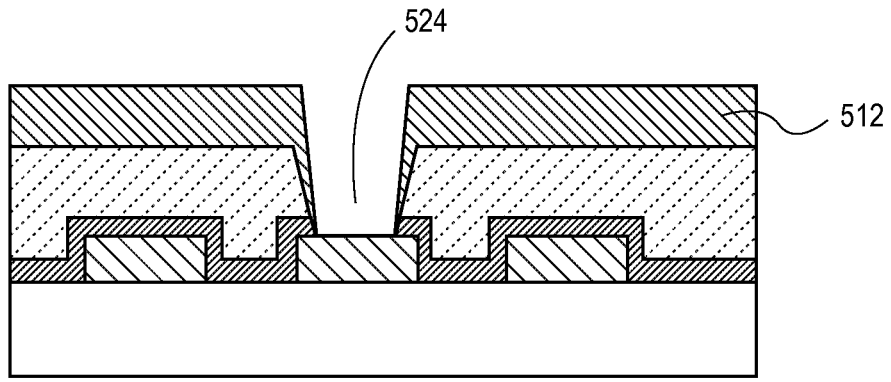

Referring to FIG. 5D, a substrate dielectric layer 512 (e.g., an ABF film) is formed, e.g., by lamination, above the photo-sensitive passivating film 514 and in the via opening 522. In an embodiment, the opening 522 has an aspect ratio of approximately 1:4 on a nominal metal line 510 landing pad of approximately 55 microns. A narrow via opening 524 is then formed in the substrate dielectric layer 512, as depicted in FIG. 5E. In an embodiment, the narrow via opening is formed by ultra-violet (UV) laser to drill a BBUL V0 (524) through the substrate dielectric layer 512 to expose a top of a metal line 510. In another embodiment, for scaling, photolithography and etch patterning is used to form BBUL V0 if a photo-sensitive ABF film is used for 512.

Figure 5F:
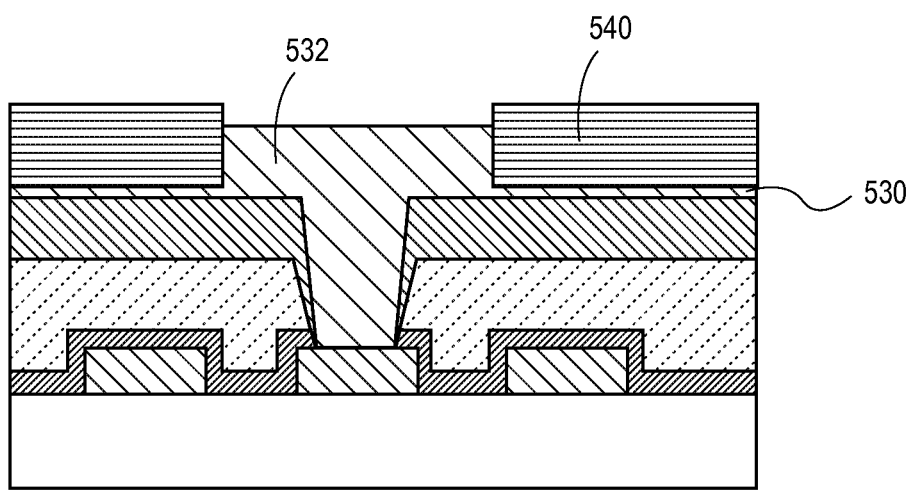
Figure 5G:
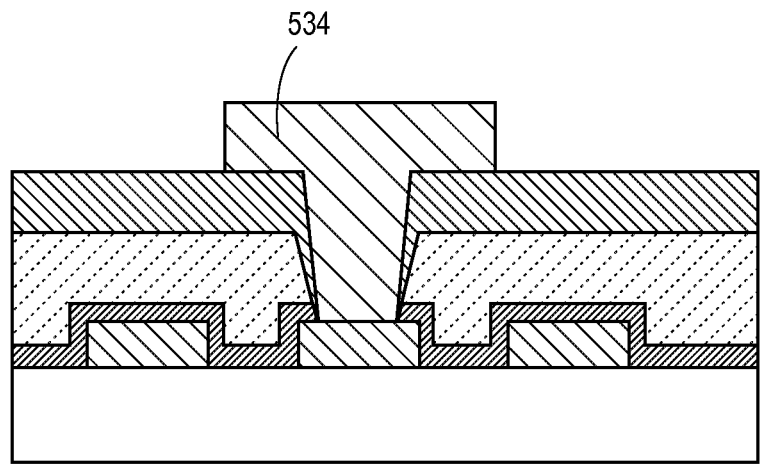

Referring to FIG. 5F, electro-less plating 530 (e.g., BBUL L0-L1 plating) followed by dry film resist (DFR) 540 patterning and L0-L1 (V0) electroplating 532 is performed. The DFR film 540 is then removed, e.g., by wet or dry etching, and final copper structure formation 534 is achieved (e.g., formation of BBUL V0 (L0-L1), as depicted in FIG. 5G. In an embodiment, after the DFR film 540 is removed, a flash etch process is performed to selectively remove the electroless copper while preserving the copper traces and vias.

Thus, in an embodiment, an incoming semiconductor die has WPR exposed and developed, with opening of a silicon nitride (e.g., by dry etching) to reveal top metal line landing pads. BBUL processing integration proceeds with ABF lamination and gap-fill over WPR and silicon nitride openings with an aspect ratio of approximately 1:4 on a nominal top metal line landing pad of approximately 55 microns. UV laser ablation is used to drill the BBUL V0 to reach the top metal line. Alternatively, for scaling, photolithography and etch patterning may be used to form BBUL V0 if a photosensitive ABF layer is used. The above approach may enable approximately 4% silicon wafer cost reduction and possible flexibility in top metal line design and scaling.

Figure 5H:
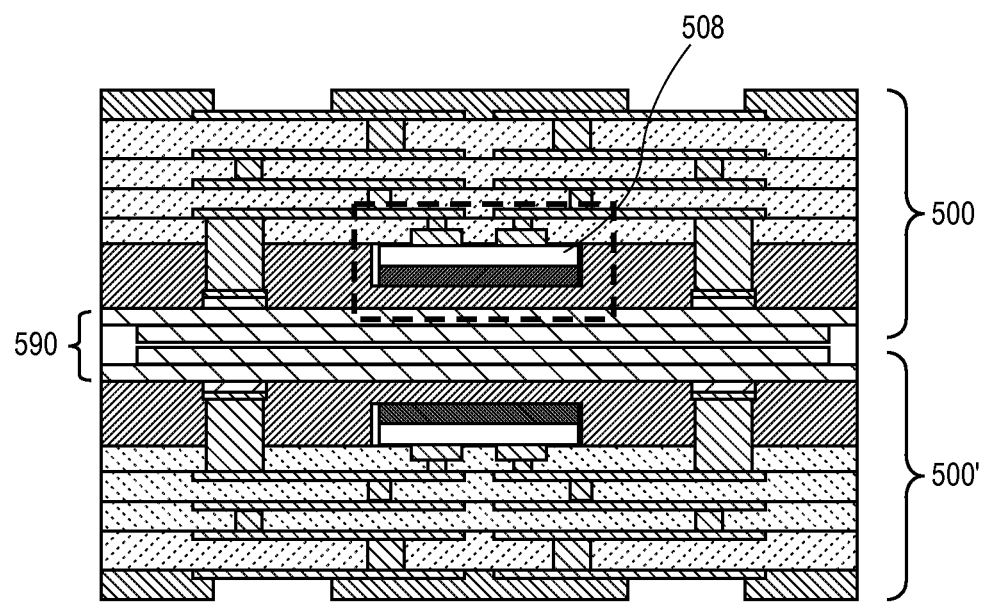

Referring to FIG. 5H, the above fabrication processes (as well as those described below in association with FIG. 6A-6F, 7A-7E, or 8A-8D) may, in an embodiment, be performed on a carrier 590. Carrier 590, such as a panel, may be provided having a plurality of cavities disposed therein, each sized to receive a semiconductor die (e.g., die 508). During processing, identical structures (e.g., 500 and 500') may be mated in order to build a back-to-back apparatus for processing utility. Consequently, processing throughput is effectively doubled. The structure shown in FIG. 5H may form part of a larger panel with a plurality of identical regions having a similar or the same cross-section. For example, a panel may include 1000 recesses on either side, allowing for fabrication of 2000 individual packages from a single panel. It is to be understood that several differing BBUL embodiments may be considered. For example, in an embodiment, a fully embedded BBUL process (e.g., where a die bonding film (DBF) side of an embedded die is flush with a first layer ABF dielectric) is used. In another embodiment, a partially embedded BBUL process (e.g., where a die is partially protruding from the ABF dielectric due to the fact that a copper cavity is sacrificed/etched during a final depanelling step). Embodiments described herein may be compatible with either BBUL process and related architectures that simply require a build up to a die interface.

Laser drilling may be accomplished using a carbon dioxide ($CO_2$) gas laser beam, an ultraviolet (UV) laser beam, or an excimer laser beam. In an embodiment of the present invention, apertures having a diameter of between 10-60 microns are formed. Laser drilling according to embodiments herein may allow for higher connection density as compared with prior art drilling processes. Thus, small via sizes and pitches may be enabled and, in this way, provide improved design and scalable miniaturization at low cost. Additionally, laser drilling may enable high alignment accuracy (e.g., 10 to 15 microns) and throughput (e.g., around 2000 vias/second) and a wide range of possible via sizes (such as between 10 microns and about 300 microns) and low cost (e.g., about 2 cents per 1000 vias). The combination of high alignment accuracy and small via size make possible via pitches as low as 40 (or lower) microns, those pitches being much less than typically plated through hole pitches of about 400 microns used on conventional packages.

In a second aspect, self-aligned via fabrication along with exclusion of copper bumps may be performed. In an example, FIGS. 6A-6F illustrate cross-sectional views representing various operations in another method of fabricating a packaged semiconductor die with a bumpless die-package interface, in accordance with another embodiment of the present invention.

Figure 6A:
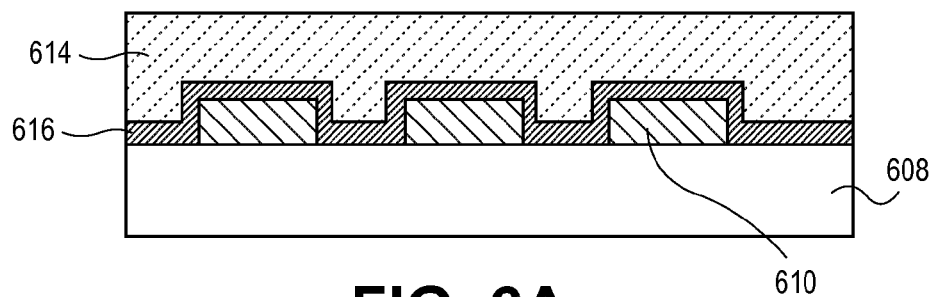
FIGS. 6A-6F illustrate cross-sectional views representing various operations in another method of fabricating a packaged semiconductor die with a bumpless die-package interface, in accordance with another embodiment of the present invention.

Referring to FIG. 6A, an incoming semiconductor die 608 has disposed thereon metal lines 610. A conformal dielectric layer 616, e.g. a silicon nitride film, is disposed on the metal lines 610. A photo-sensitive passivating film 614 (e.g., a WPR film) is disposed on the conformal dielectric layer 616. The photo-sensitive passivating film 614 may have a thickness approximately in the range of 13-15 microns, the metals lines 610 may have a thickness approximately in the range of 4-8 microns, and the conformal dielectric layer 616 may have a thickness approximately in the range of 1-2 microns.

Figure 6B:
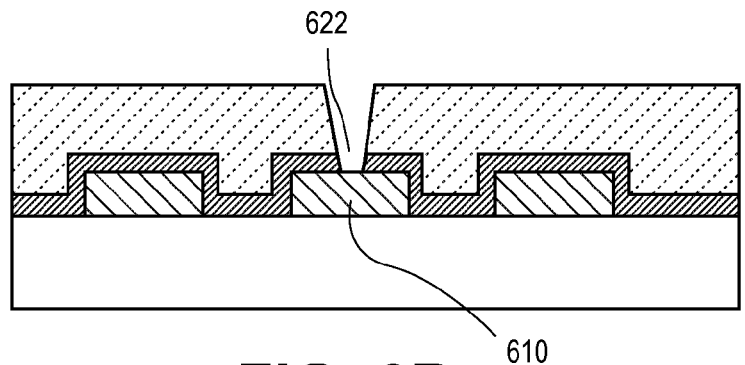
Figure 6C:
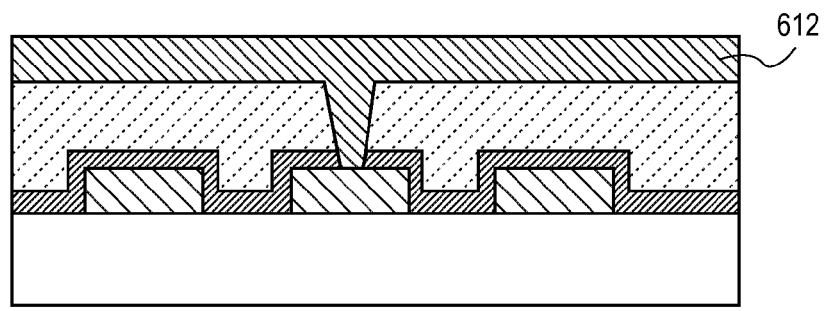

Referring to FIG. 6B, the photo-sensitive passivating film 614 and the conformal dielectric layer 616 are patterned (e.g., by lithography and etch) to form a via opening 622 and to expose a top of a metal line 610. In an embodiment, the narrowest width of via opening 622 is less than approximately 6 microns. In an embodiment, BBUL panel level design rules need not be accommodated in this approach. A photo-sensitive substrate dielectric layer 612 (e.g., a photo-sensitive ABF film) is formed, e.g., by lamination, above the photo-sensitive passivating film 614 and in the via opening 622, as depicted in FIG. 6C. In an embodiment, the opening 622 has an aspect ratio of approximately 2:1 on a nominal metal line 610 landing pad of approximately 6 microns.

Figure 6D:
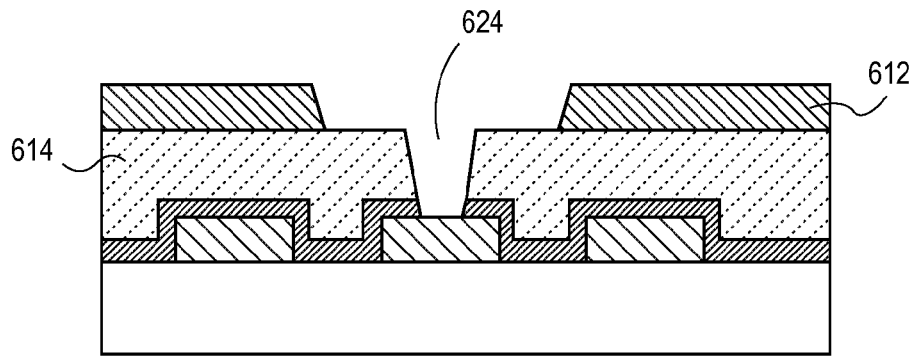

Referring to FIG. 6D, a two-layer via opening 624 is then formed in the photo-sensitive substrate dielectric layer 612 and in the photo-sensitive passivating film 614. In an embodiment, the photo-sensitive substrate dielectric layer 612 is photo-exposed and developed using BBUL panel-level process. Tight fab-level design rules for TV1 on metal layer 610 may be maintained despite a lower resolution for BBUL panel level photolithography processes on BBUL L1 since the TV1 is already "self-aligned" to the metal line 610 using the semiconductor lithography processing.

Figure 6E:
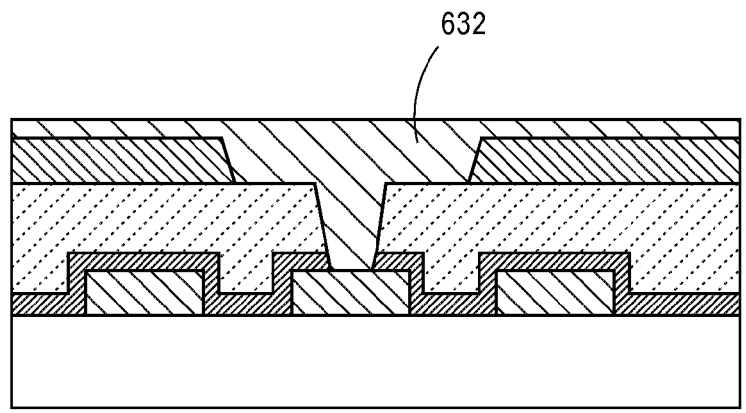
Figure 6F:
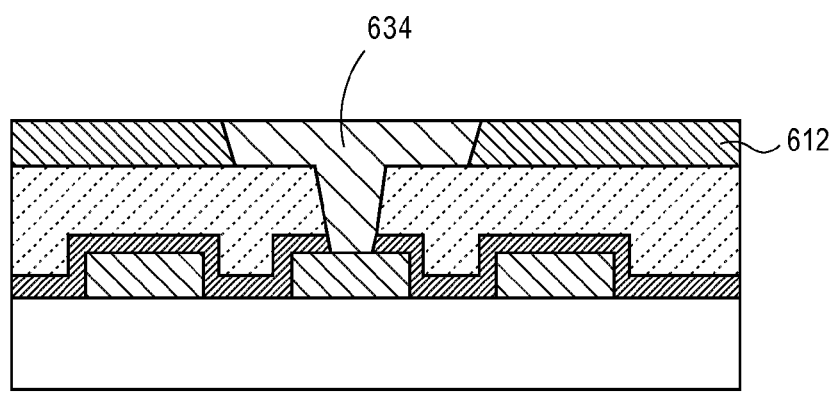

Referring to FIG. 6E, a copper structure 632 is formed by initial electro-less plating and subsequent electroplating. Final copper structure formation 634 may be achieved by planarization of 632, e.g., by chemical mechanical polishing, as depicted in FIG. 6F. It is to be understood, however, that a BBUL flow typically involves electro-less copper formation throughout via openings and the surface of the ABF. Then, the DFR is patterned to define L1 traces, etc. Subsequently, plating up is performed selectively due to the presence of DFR openings. The DFR is stripped and a flash etch is performed to remove electro-less copper.

In a third aspect, both copper bumps and a WPR layer may be removed from an incoming semiconductor die. In an example, FIGS. 7A-7E illustrate cross-sectional views representing various operations in another method of fabricating a packaged semiconductor die with a bumpless die-package interface, in accordance with another embodiment of the present invention.

Figure 7A:
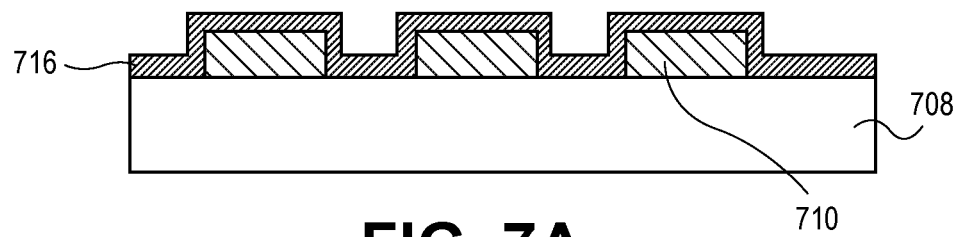
FIGS. 7A-7E illustrate cross-sectional views representing various operations in another method of fabricating a packaged semiconductor die with a bumpless die-package interface, in accordance with another embodiment of the present invention.

Referring to FIG. 7A, an incoming semiconductor die 708 has disposed thereon metal lines 710. A conformal dielectric layer 716, e.g. a silicon nitride film, is disposed on the metal lines 710. The metals lines 710 may have a thickness approximately in the range of 4-8 microns, and the conformal dielectric layer 716 may have a thickness approximately in the range of 1-2 microns.

Figure 7B:
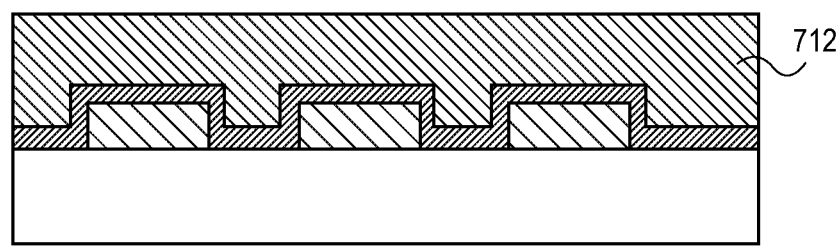
Figure 7C:
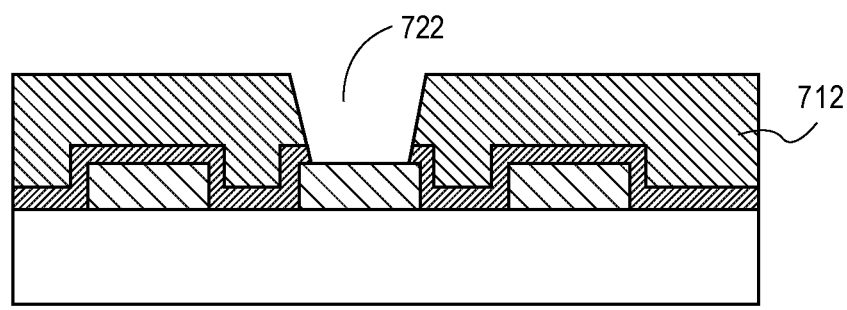

Referring to FIG. 7B, a substrate dielectric layer 712 (e.g., an ABF film) is formed, e.g., by lamination, above the conformal dielectric layer 716. In an embodiment, ABF lamination and gap-fill over silicon nitride topography is performed with an aspect ratio approximately in the range of 1.5:1 to 2:1 on a fine approximately 2-3 micron spacing. A via opening 722 is then formed in the substrate dielectric layer 712, as depicted in FIG. 7C. In an embodiment, the via opening 722 is formed by UV laser to drill a BBUL V0 (722) through the substrate dielectric layer 712 and the conformal dielectric layer 716 to expose a top of a metal line 710. In another embodiment, for scaling, photolithography and etch patterning is used to form BBUL V0 if a photosensitive ABF film is used for 712.

Figure 7D:
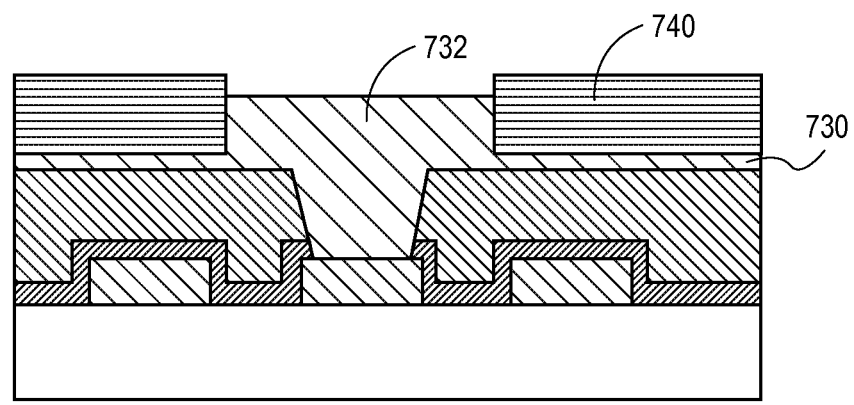
Figure 7E:
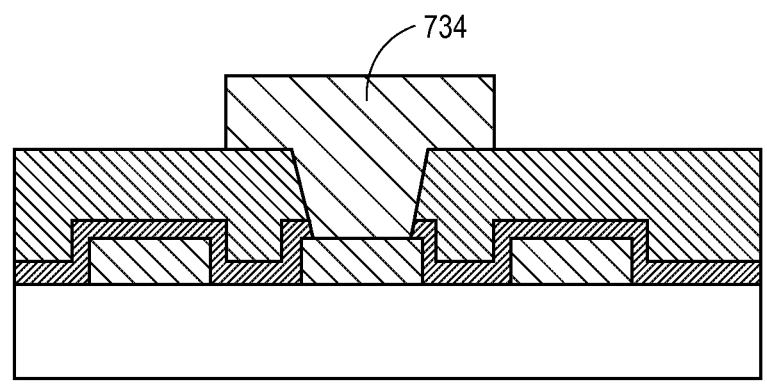

Referring to FIG. 7D, electro-less plating 730 (e.g., BBUL L0-L1 plating) followed by dry film resist (DFR) 740 patterning and L0-L1 (V0) electroplating 732 is performed. The DFR film 740 is then removed, e.g., by wet or dry etching, and final copper structure formation 734 is achieved (e.g., formation of BBUL V0 (L0-L1), as depicted in FIG. 7E. As noted above, in an embodiment, after DFR film removal, a flash etch operation may be performed to selectively remove the electro-less copper while preserving the copper traces/vias.

In a fourth aspect, copper bumps, a surface copper layer, and a WPR layer may be removed from an incoming semiconductor die. In an example, FIGS. 8A-8D illustrate cross-sectional views representing various operations in another method of fabricating a packaged semiconductor die with a bumpless die-package interface, in accordance with another embodiment of the present invention.

Figure 8A:
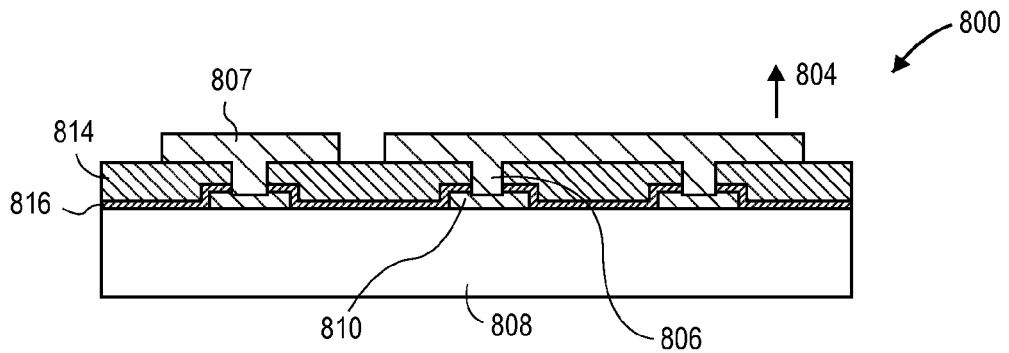
FIGS. 8A-8D illustrate cross-sectional views representing various operations in another method of fabricating a packaged semiconductor die with a bumpless die-package interface, in accordance with another embodiment of the present invention.

Referring to FIG. 8A, a portion 800 of a partially completed semiconductor package includes a portion of a substrate having a land side 804 with a lowermost layer of conductive routing, such as conductive feature 806 shown in FIG. 8. The substrate also includes a next lowermost layer of conductive routing 807 disposed directly on the lowermost layer of conductive routing 806. The semiconductor package also includes a semiconductor die (portion 808 shown) embedded in the substrate. The semiconductor die 808 has an uppermost layer of conductive lines, such as conductive line 810 shown in FIG. 8. At least one of the conductive lines 810 is coupled directly to the lowermost layer of conductive routing 806 of the substrate. In accordance with an embodiment of the present invention, the conductive line 810 of the semiconductor die 808 and the lowermost layer of conductive routing 806 of the substrate form a bumpless interface between the substrate and the semiconductor die 808. In an embodiment, the next lowermost layer of conductive routing 807 is a layer of conductive traces. In one such embodiment, the lowermost layer of conductive routing 806 is a layer of conductive vias. In another such embodiment, the lowermost layer of conductive routing 806 is a layer of conductive traces.

In an embodiment, the substrate further includes a photosensitive passivating film 814 (e.g., a WPR film) encapsulating the lowermost layer of conductive routing 806. In one such embodiment, the semiconductor die 808 further includes a conformal dielectric layer 816, such as a silicon nitride layer, disposed on and covering at least a portion of the uppermost layer of conductive lines 810. The photo-sensitive passivating film 814 is disposed directly on the conformal dielectric layer 816. In an embodiment, the conductive line 810 of the semiconductor die 808 and the lowermost layer of conductive routing 806 of the substrate are composed of copper. Thus, in an embodiment, an incoming semiconductor die has no copper bumps and has a surface copper layer plated on a WPR layer. It is to be understood that other layers not shown may be included, such as a titanium layer at a WPR and layer 1 copper interface.

Figure 8B:
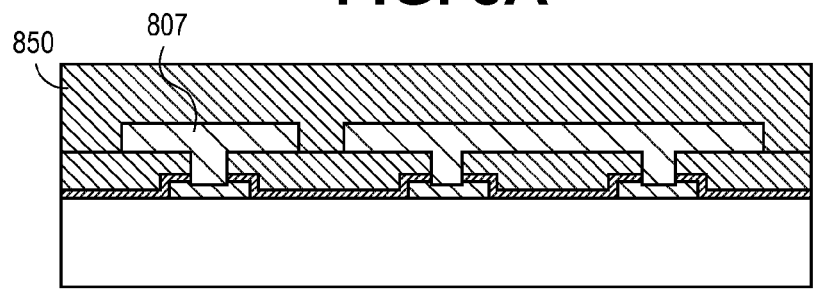
Figure 8C:
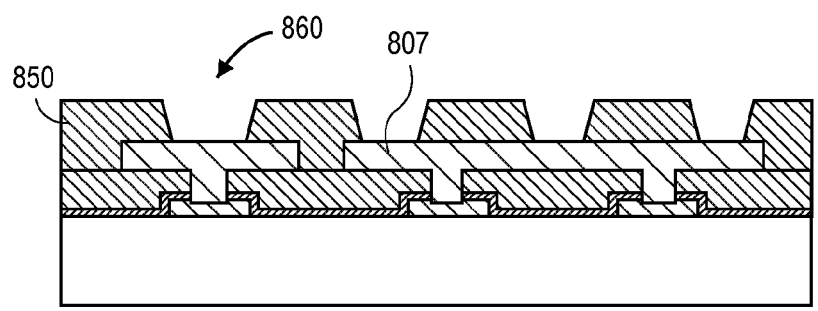
Figure 8D:
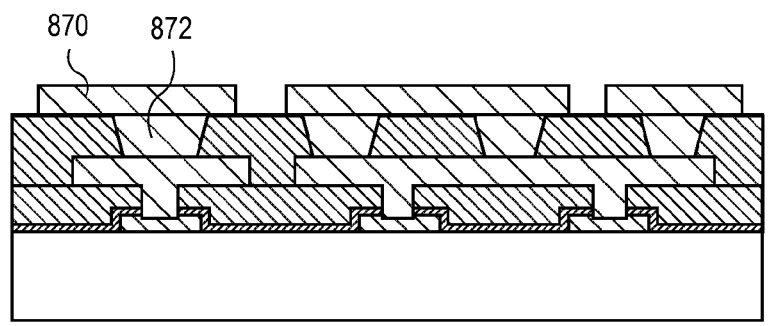

Referring to FIG. 8B, surface roughening and subsequent first substrate dielectric layer (e.g., first ABF layer) 850 lamination is performed over surface copper layer 807 and WPR layer 814. UV laser drilling is then used to form the via opening 860 through the first substrate dielectric layer 850, as depicted in FIG. 8C. Alternatively, for scaling, photolithography and etch patterning may be used if a photosensitive ABF layer is used for 850. Referring to FIG. 8D, standard BBUL electro-less plating followed by DFR patterning and then electroplating of vias 872 and layer 2 copper 870, and finally DFR removal is performed. After the DFR film is removed, a flash etch operation may be performed to selectively remove the electro-less copper while preserving the copper traces/vias. The layer 2 copper may thus be limited to the size of the semiconductor die 808, as described in association with FIG. 4 above. In general, regarding the process flows described in FIGS. 7A-7E and 8A-8D, a difference between the latter flow and the former flow is that the fab process may directly fabricate and plate up the L1 layer (e.g., by skipping the Cu bumps) according to fab design rules. After that, a BBUL process may be performed with the first ABF dielectric layer.

Thus, in an embodiment, instead of plating copper bumps onto a WPR layer, a surface copper layer is instead plated. An incoming semiconductor die has an exposed surface layer. BBUL process integration proceeds with ABF lamination followed by UV laser/desmear/plating to form the subsequent substrate buildup layers. In one such embodiment, the incoming semiconductor die has no tall copper bumps on the WPR layer, but instead has surface layer copper formed thereon. The BBUL process integration proceeds with surface roughening and ABF lamination followed by UV laser and desmear and plating to form the via, and subsequent substrate buildup layer formation. With the approach, a reduction in the number of substrate copper layers may be achieved to reduce overall package height and cost. Also, the top metal line (TM1) and TV1 dimensions need not be changed for implementing such an approach.

In an embodiment, one or more of the above described semiconductor packages housing semiconductor are paired with other packages following the packaging process, e.g., the coupling of a packaged memory die with a package logic die. In an example, connections between two or more individually packaged die may be made post BBUL fabrication by using thermal compression bonding (TCB) processing. In another embodiment, more than one both die are embedded in the same package. For example, in one embodiment, a packaged semiconductor die with a bumpless die-package interface further includes a secondary stacked die. The first die may have one or more through-silicon vias disposed therein (TSV die). The second die may be electrically coupled to the TSV die through the one or more through-silicon vias. The apparatus may also include a coreless substrate. In one embodiment, both die are embedded in the coreless substrate.

Thus, embodiments of the present invention enable a packaged semiconductor die with a bumpless die-package interface. Such embodiments may provide benefits such as, but not limited to, cost reduction, package Z height reduction and lower interlayer dielectric (ILD) stresses. The unique combination of components and techniques described herein may be fully compatible with conventional equipment toolsets.

Figure 9:
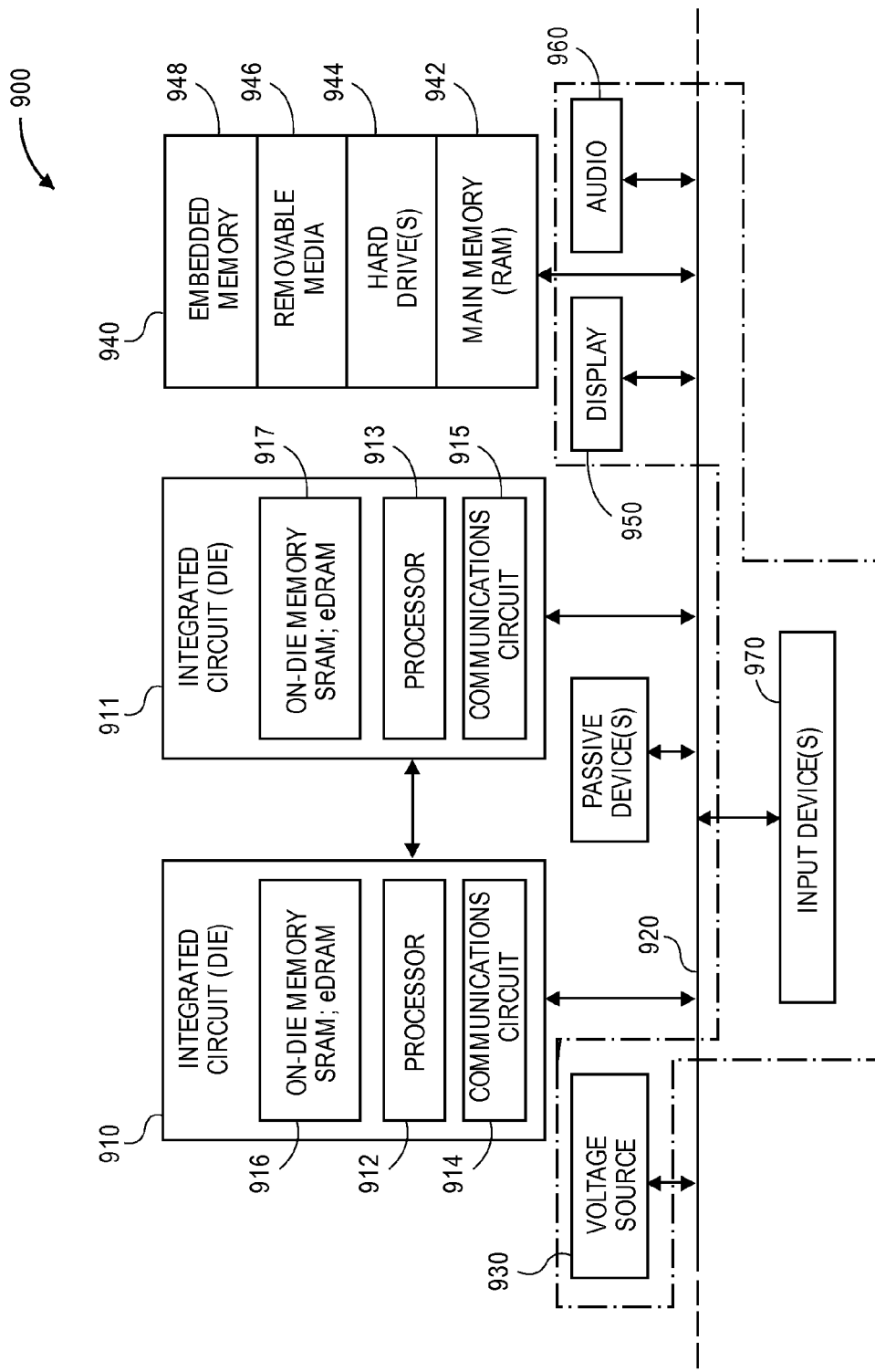
FIG. 9 is a schematic of a computer system, in accordance with an embodiment of the present invention.

FIG. 9 is a schematic of a computer system 900, in accordance with an embodiment of the present invention. The computer system 900 (also referred to as the electronic system 900) as depicted can embody a packaged semiconductor die with a bumpless die-package interface according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 is a packaged semiconductor die with a bumpless die-package interface disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems. In an embodiment, the processor 910 includes on-die memory 916 such as static random-access memory (SRAM). In an embodiment, the processor 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in an embedded TSV die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a packaged semiconductor die with a bumpless die-package interface according to any of the several disclosed embodiments and their equivalents, an electronic system, a computer system, one or more methods of fabricating an integrated circuit, and one or more methods of fabricating an electronic assembly that includes a packaged semiconductor die with a bumpless die-package interface according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed packaged semiconductor die with a bumpless die-package interface embodiments and their equivalents. A foundation substrate may be included, as represented by the dashed line of FIG. 9. Passive devices may also be included, as is also depicted in FIG. 9.

Thus, a packaged semiconductor die with a bumpless die-package interface and methods to form such a packaged semiconductor die have been disclosed. In an embodiment, a semiconductor package includes a substrate having a land side with a lowermost layer of conductive vias. A semiconductor die is embedded in the substrate. The semiconductor die has an uppermost layer of conductive lines. At least one of the conductive lines is coupled directly to a conductive via of the lowermost layer of conductive vias of the substrate. In one such embodiment, the conductive via and the conductive line are composed of copper and form a bumpless interface between the substrate and the semiconductor die. In another embodiment, a semiconductor package includes a substrate having a land side with a lowermost layer of conductive vias. A semiconductor die is embedded in the substrate. The semiconductor die has an uppermost layer of conductive lines with a layer of conductive vias disposed thereon. At least one of the conductive lines is coupled directly to a conductive via of the semiconductor die which is coupled directly to a conductive via of the lowermost layer of conductive vias of the substrate. In one such embodiment, the conductive via of the substrate, the conductive via of the semiconductor die, and the conductive line are composed of copper and form a bumpless interface between the substrate and the semiconductor die.

What is claimed is:

1. A semiconductor package, comprising:
   a substrate having a land side with a lowermost layer of conductive vias; and
   a semiconductor die embedded in the substrate, the semiconductor die having an uppermost layer of conductive lines, wherein at least one of the conductive lines is coupled directly to a conductive via of the lowermost layer of conductive vias of the substrate.

2. The semiconductor package of claim 1, wherein the substrate comprises a substrate dielectric layer encapsulating the conductive via and disposed on at least a portion of the conductive line.

3. The semiconductor package of claim 1, further comprising:
   a patterned photo-sensitive passivating film disposed adjacent to the conductive line.

4. The semiconductor package of claim 1, wherein the substrate is a bumpless build-up layer (BBUL) substrate.

5. The semiconductor package of claim 1, wherein the substrate is a coreless substrate.

6. The semiconductor package of claim 1, wherein the conductive via and the conductive line comprise copper and form a bumpless interface between the substrate and the semiconductor die.

7. A semiconductor package, comprising:
   a substrate having a land side with a lowermost layer of conductive vias; and
   a semiconductor die embedded in the substrate, the semiconductor die having an uppermost layer of conductive lines with a layer of conductive vias disposed thereon, wherein at least one of the conductive lines is coupled directly to a conductive via of the semiconductor die which is coupled directly to a conductive via of the lowermost layer of conductive vias of the substrate.

8. The semiconductor package of claim 7, wherein the substrate comprises a substrate dielectric layer encapsulating the conductive via of the substrate but not encapsulating the conductive via of the semiconductor die.

9. The semiconductor package of claim 8, wherein the substrate dielectric layer is photosensitive.

10. The semiconductor package of claim 7, further comprising:
a passivating film disposed adjacent to the conductive via of the semiconductor die.

11. The semiconductor package of claim 7, wherein the conductive via of the semiconductor die and the conductive via of the substrate are self-aligned.

12. The semiconductor package of claim 7, wherein the substrate is a bumpless build-up layer (BBUL) substrate.

13. The semiconductor package of claim 7, wherein the substrate is a coreless substrate.

14. The semiconductor package of claim 7, wherein the conductive via of the substrate, the conductive via of the semiconductor die, and the conductive line comprise copper and form a bumpless interface between the substrate and the semiconductor die.

15. A semiconductor package, comprising:
a substrate, comprising:
a land side with a lowermost layer of conductive vias; and
a substrate dielectric layer encapsulating the layer of conductive vias; and
a semiconductor die embedded in the substrate, the semiconductor die comprising:
an uppermost layer of conductive lines, wherein at least one of the conductive lines is coupled directly to a conductive via of the lowermost layer of conductive vias of the substrate; and
a conformal dielectric layer disposed on and covering at least a portion of the uppermost layer of conductive lines, wherein the substrate dielectric layer is disposed directly on the conformal dielectric layer.

16. The semiconductor package of claim 15, wherein the substrate is a bumpless build-up layer (BBUL) substrate.

17. The semiconductor package of claim 15, wherein the substrate is a coreless substrate.

18. The semiconductor package of claim 15, wherein the conductive via and the conductive line comprise copper and form a bumpless interface between the substrate and the semiconductor die.

19. A semiconductor package, comprising:
a substrate, comprising:
a land side with a lowermost layer of conductive routing; and
a next lowermost layer of conductive routing disposed directly on the lowermost layer of conductive routing; and
a semiconductor die embedded in the substrate, the semiconductor die having an uppermost layer of conductive lines, wherein at least one of the conductive lines is coupled directly to the lowermost layer of conductive routing of the substrate.

20. The semiconductor package of claim 19, wherein the substrate further comprises a photo-sensitive passivating film encapsulating the lowermost layer of conductive routing.

21. The semiconductor package of claim 20, wherein the semiconductor die further comprises a conformal dielectric layer disposed on and covering at least a portion of the uppermost layer of conductive lines, wherein photo-sensitive passivating film is disposed directly on the conformal dielectric layer.

22. The semiconductor package of claim 19, wherein the next lowermost layer of conductive routing is a layer of conductive traces.

23. The semiconductor package of claim 22, wherein the lowermost layer of conductive routing is a layer of conductive vias.

24. The semiconductor package of claim 22, wherein the lowermost layer of conductive routing is a layer of conductive traces.

25. The semiconductor package of claim 19, wherein the lowermost layer of conductive routing is, from a top-down perspective, confined to the size of the semiconductor die.

26. The semiconductor package of claim 19, wherein the substrate is a bumpless build-up layer (BBUL) substrate.

27. The semiconductor package of claim 19, wherein the substrate is a coreless substrate.

28. The semiconductor package of claim 19, wherein the conductive line of the semiconductor die and the lowermost layer of conductive routing of the substrate comprise copper and form a bumpless interface between the substrate and the semiconductor die.

* * * * *